(12) United States Patent
Mathur et al.

(10) Patent No.: US 10,839,934 B2
(45) Date of Patent: Nov. 17, 2020

(54) REDUNDANCY CIRCUITRY FOR MEMORY APPLICATION

(71) Applicant: Arm Limited, Cambridge (GB)

(72) Inventors: Rahul Mathur, Austin, TX (US); Andy Wangkun Chen, Austin, TX (US); Gaurang Prabhakar Narvekar, Austin, TX (US); Sanjay Mangal, Austin, TX (US); Yew Keong Chong, Austin, TX (US); Bikas Maiti, Austin, TX (US); Martin Jay Kinkade, Austin, TX (US)

(73) Assignee: Arm Limited, Cambridge (GB)

( * ) Notice: Subject to any disclaimer, the term of this patent is extended or adjusted under 35 U.S.C. 154(b) by 114 days.

(21) Appl. No.: 15/993,333

(22) Filed: May 30, 2018

(65) Prior Publication Data

US 2019/0371424 A1 Dec. 5, 2019

(51) Int. Cl.
*G11C 29/00* (2006.01)

(52) U.S. Cl.
CPC .................... *G11C 29/789* (2013.01)

(58) Field of Classification Search
CPC .................................................. G11C 29/789
USPC .......................................................... 365/154
See application file for complete search history.

(56) References Cited

U.S. PATENT DOCUMENTS

| | | | | |
|---|---|---|---|---|
| 6,002,620 A * | 12/1999 | Tran | .................... | G11C 11/5621 365/200 |
| 6,271,571 B1 * | 8/2001 | Polizzi | .................. | G11C 16/26 257/299 |
| 7,495,976 B2 * | 2/2009 | Mittal | ....................... | G11C 8/10 365/200 |
| 7,924,638 B2 * | 4/2011 | Gajjewar | ............. | G11C 29/848 365/195 |
| 9,666,307 B1 * | 5/2017 | Fujiwara | ................ | G11C 29/76 |
| 10,192,013 B1 * | 1/2019 | Arora | ................. | G11C 29/1201 |
| 2001/0003509 A1 * | 6/2001 | Hosono | ..................... | G11C 7/20 365/185.05 |
| 2002/0003744 A1 * | 1/2002 | Forbes | ..................... | G11C 8/10 365/230.06 |
| 2003/0151437 A1 * | 8/2003 | Demone | .............. | G11C 29/789 327/218 |
| 2003/0156475 A1 * | 8/2003 | Kang | ................... | G11C 29/846 365/200 |
| 2004/0019763 A1 * | 1/2004 | Lakhani | ................. | G11C 29/76 711/206 |
| 2005/0002244 A1 * | 1/2005 | Yaoi | .................... | H01L 29/7887 365/200 |
| 2005/0057961 A1 * | 3/2005 | Ahmad | ................ | G11C 29/804 365/154 |
| 2005/0262465 A1 * | 11/2005 | Goyal | ..................... | G06F 30/39 716/104 |
| 2006/0092725 A1 * | 5/2006 | Min | ..................... | G11C 29/789 365/200 |

(Continued)

*Primary Examiner* — Sung Il Cho (74) *Attorney, Agent, or Firm* — Pramudji Law Group PLLC; Ari Pramudji (57) ABSTRACT

Various implementations described herein refer to an integrated circuit. The integrated circuit may include memory circuitry having multiple bitcell arrays with redundant rows of bitcells. The integrated circuit may include comparator logic disposed outside the memory circuitry to de-assert access to one or more faulty rows of bitcells and to assert access to the redundant rows of bitcells.

21 Claims, 7 Drawing Sheets (56) References Cited

U.S. PATENT DOCUMENTS

| | | | | |
|---|---|---|---|---|
| 2007/0002646 A1* | 1/2007 | Martin | ................ | G11C 17/165 |
| | | | | 365/200 |
| 2008/0225613 A1* | 9/2008 | Afghahi | ............... | G11C 29/789 |
| | | | | 365/200 |
| 2012/0069685 A1* | 3/2012 | Ide | ...................... | G11C 29/802 |
| | | | | 365/189.05 |
| 2012/0120735 A1* | 5/2012 | Kubouchi | ................ | G11C 7/10 |
| | | | | 365/189.05 |
| 2012/0120750 A1* | 5/2012 | Kubouchi | ............ | G11C 29/785 |
| | | | | 365/203 |
| 2013/0077420 A1* | 3/2013 | Iwai | .................... | G11C 29/785 |
| | | | | 365/200 |
| 2013/0290753 A1* | 10/2013 | Ramaraju | ................ | G06F 1/26 |
| | | | | 713/320 |
| 2013/0322160 A1* | 12/2013 | Kim | ...................... | G11C 29/04 |
| | | | | 365/154 |
| 2015/0135038 A1* | 5/2015 | Wilson | ................... | G11C 29/76 |
| | | | | 714/773 |
| 2015/0287480 A1* | 10/2015 | Wilson | ................... | G11C 29/70 |
| | | | | 365/96 |
| 2017/0084353 A1* | 3/2017 | Park | ................... | G11C 11/4087 |

\* cited by examiner

| | | |
|---|---|---|
| Core Array Circuitry 204,204D1 | WDX 206,206D | Core Array Circuitry 204,204D2 |
| SA & Drivers 218,218B1 | CK 208,208C | SA & Drivers 218,218B2 |
| Core Array Circuitry 204,204C1 | WDX 206,206C | Core Array Circuitry 204,204C2 |
| Core Array Circuitry 204,204B1 | WDX 206,206B | Core Array Circuitry 204,204B2 |
| RR Core Array 212,212A | RR WDX 214 | RR Core Array 212,212B |
| SA & Drivers 218,218A1 | CK 208,208B | SA & Drivers 218,218A2 |
| Core Array Circuitry 204,204A1 | WDX 206,206A | Core Array Circuitry 204,204A2 |
| I/O 110,110A | CK_I/O 208,208A | I/O 110,100B |

REDUNDANCY CIRCUITRY FOR MEMORY APPLICATION

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern technology scaling, memory device sizes continue to shrink, and as such, increased density typically affects memory device yield. This limited yield may thus increase the manufacturing cost of the whole chip. Therefore, redundancy with test and/or repair capability may be applied to improve the memory device yield. However, some conventional redundancy techniques may increase performance and area penalties. As such, there is an increasing need to address this defect problem in multiple rows in a more efficient way with respect to power, performance and area (PPA).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to redundancy circuitry for various integrated circuit applications. For instance, some implementations described herein are related to efficient redundancy schemes and/or techniques for handling bitcell failures in multiple rows of some memory applications, such as, e.g., static random access memory (SRAM), for improved power, performance and area (PPA). Various redundancy schemes and/or techniques provided herein may be used for address comparison that may be performed external to memory with a register transfer logic (RTL) wrapper, which may be shared across multiple memory instances in a system-on-a-chip (SoC). As such, these redundancy schemes and/or techniques may lead to significant area leverage for SoC implementation, e.g., when customer mandates use of redundancy.

Various implementations of redundancy circuitry will now be described in detail herein with reference to FIGS. 1-7.

Figure 1:
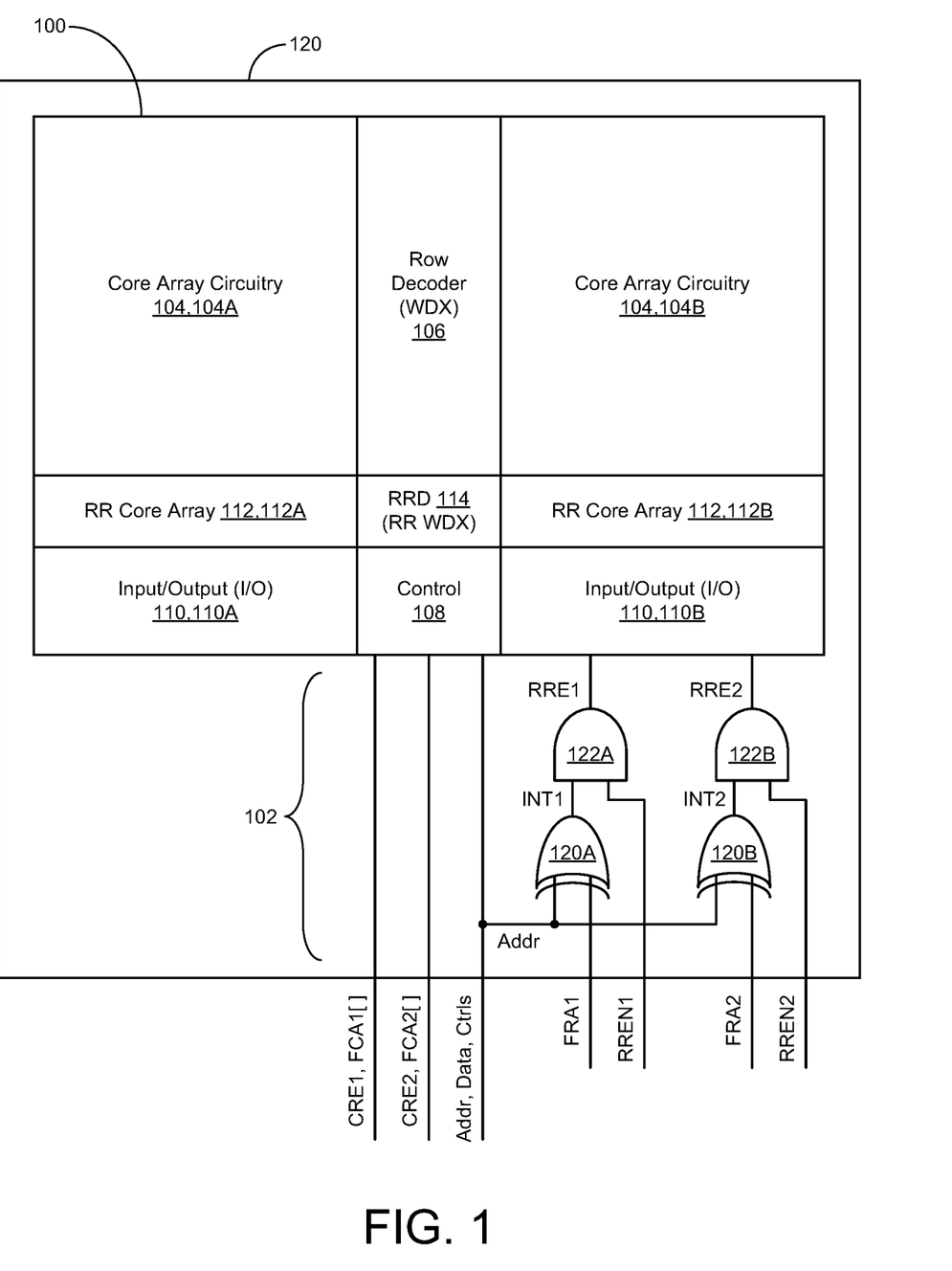
FIG. 1 illustrates a block diagram of memory circuitry having comparator logic for redundancy in accordance with various implementations described herein.

FIG. 1 illustrates a diagram of memory circuitry 100 having comparator logic 102 for redundancy in accordance with various implementations described herein. In this instance, the memory circuitry 100 includes core circuitry 104 having multiple bitcell arrays that are implemented with a single bank of bitcells and/or multiple banks of bitcells.

The memory circuitry 100 may be implemented as an integrated circuit (IC) in using various types of memory, such as, e.g., random access memory (RAM), including static RAM (SRAM), and/or any other types of volatile memory. In some implementations, the integrated circuit (IC) refers to a register transfer logic (RTL) wrapper 120 that includes the memory circuitry 100 and the comparator logic 102 that is disposed separately from the memory circuitry 100 within the RTL wrapper 120. Further, in some implementations, the memory circuitry 100 may be implemented as an IC with dual rail memory architecture and related circuitry. The memory circuitry 100 may be integrated with computing circuitry and related components on a single chip. The memory circuitry 100 may be implemented in embedded systems for various electronic and mobile applications, including low power sensor nodes for IoT (Internet of things) applications.

As shown in FIG. 1, the memory circuitry 100 includes memory, such as, e.g., core circuitry 104 having multiple bitcell arrays, including a first bitcell array 104A and a second bitcell array 104B. Each bitcell array 104A, 104B may include multiple bitcells, and each bitcell may be referred to as a memory cell, and each bitcell may be configured to store at least one data bit value (e.g., data value related to a logical '0' or '1'). Each bitcell array 104A, 104B may include any number of bitcells arranged in various configurations, such as, e.g., a two-dimensional (2D) memory array having any number of columns (Ncolumns) and any number of rows (Nrows) of multiple bitcells, which may be arranged in a 2D grid pattern with 2D indexing capabilities. Also, each bitcell may be implemented with random access memory (RAM) circuitry, and/or some other type of volatile type memory. For instance, each bitcell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In some instances, the memory circuitry 100 may operate at a source voltage level VDD with a voltage range that varies with technology.

The memory circuitry 100 may include wordline (WL) row decoder circuitry 106 (ROWDEC) that accesses each of the bitcells via a selected wordline (WL) that is driven by wordline driver circuitry. The combination of WL decoder 106 and WL driver may be referred to as (WDX). The memory circuitry 100 (including the core circuitry 104, bitcells, and the row decoder 106) may operate at a first supply voltage, such as, e.g., a core supply voltage VDDC. The voltage range varies with technology. In other instances, the row decoder 106 may operate at the core supply voltage VDDC, and other components, such as, e.g., the WL driver may generate a wordline signal at a second supply voltage that may be different than the first or core supply voltage VDDC, such as, e.g., a periphery supply voltage VDDP.

The memory circuitry 100 may include periphery circuitry having control block circuitry 108 and column decoder circuitry 110 (COLDEC), such as, e.g., input/output (I/O) circuitry 110A, 110B that is used to access each of the bitcells via one or more selected bitlines BL, . . . , BLn. In some instances, the selected bitlines BL, . . . , BLn may include a selected pair of complementary bitlines BL/NBL, . . . , BLn/NBLn. In other instances, the periphery circuitry may include the row decoder (ROWDEC) 106 coupled to the wordline driver and the column decoder (COLDEC) 110 to select at least one bitcell in the arrays 104A, 104B of bitcells with a wordline (WL) signal and a bitline (BL) signal. The periphery circuitry may operate at the second or periphery supply voltage VDDP, that is different than a core supply voltage VDDC. The voltage range varies with technology. The column decoder (COLDEC) 110 may also operate at the periphery supply voltage VDDP, and the control block circuitry 108, the column decoder (COLDEC) 110, and/or components associated therewith may receive one or more address signals (A, Addr), data signals (D), various control signals (ctrls), and one or more other I/O signals (RRE1, RRE2, CRE1, FCA1[ ], CRE2, FCA2[ ]).

Further, as shown in FIG. 1, the memory circuitry 100 may include redundant row (RR) memory, such as, e.g., RR core array circuitry 112 having multiple RR bitcell arrays, including a first RR bitcell array 112A and a second RR bitcell array 112B. Each RR bitcell array 112A, 112B may include multiple bitcells, and each bitcell may be referred to as a memory cell, and each bitcell may be configured to store at least one data bit value (e.g., data value related to a logical '0' or '1'). Each RR bitcell array 112A, 112B may include any number of bitcells arranged in various configurations, such as, e.g., a two-dimensional (2D) memory array having any number of columns (Ncolumns) and any number of rows (Nrows) of multiple bitcells, which may be arranged in a 2D grid pattern with 2D indexing capabilities. Also, each bitcell may be implemented with random access memory (RAM) circuitry, and/or some other type of volatile type memory. For instance, each bitcell may include a multitransistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In some instances, the memory circuitry 100 may operate at a source voltage level VDD with a voltage range that varies with technology.

The memory circuitry 100 includes wordline (WL) redundant row (RR) decoder circuitry 114 (RRD or RROWDEC) that accesses each of the RR of bitcells 112A, 112B via a selected wordline (WL) that is driven by wordline driver circuitry. The combination of WL RR decoder 114 and WL driver may be referred to as (RR WDX). The memory circuitry 100 (including the RR core circuitry 112, RR of bitcells, and the redundant row decoder 114) may operate at the first supply voltage, such as, e.g., the core supply voltage VDDC. The voltage range varies with technology. In other instances, the RR decoder 114 may operate at the core supply voltage VDDC, and other components, such as, e.g., the WL RR driver may generate a wordline signal at a second supply voltage that may be different than the first or core supply voltage VDDC, such as, e.g., VDDP.

As further shown in FIG. 1, the memory circuitry 100 includes the comparator logic 102 which is disposed outside the memory circuitry 100 to de-assert access to one or more faulty rows of bitcells and to assert access to the redundant rows of bitcells 112, 112A, 112B. In some instances, the faulty rows of bitcells refer to one or more rows of bitcells having one or more bitcells that have been tested and determined to be damaged, defective or have some sort of defect. In some instances, the comparator logic 102 may include one or more control logic gates that are arranged to receive multiple input signals (Addr, FRA1, RREN1, FRA2, RREN2) and provide row redundancy control signals (RRE1, RRE2) to the memory circuitry 100. The one or more control logic gates of the comparator logic 102 may be implemented with one or more XOR gates 120A, 120B and one or more AND gates 122A, 122B. However, in various other instances, any type of logic gate(s) may be used to implement the comparator logic 102.

In some implementations, the control logic gates of the comparator logic may include a first XOR gate 120A, a second XOR gate 120B, a first AND gate 122A, and a second AND gate 122B that are arranged to receive multiple input signals (Addr, FRA1, RREN1, FRA2, RREN2) and provide row redundancy control signals (RRE1, RRE2) to the memory circuitry 100. For instance, the first XOR gate 120A receives the address signal (Addr) and a first faulty row address signal FRA1 and provides a first intermediate signal INT1 to the first AND gate 122A based on the received signals (Addr, FRA1), and the second XOR gate 120B may also receive the address signal (Addr) and a second faulty row address signal FRA2 and provide a second intermediate signal INT2 to the second AND gate 122B based on the received signals (Addr, FRA2). Also, the first AND gate 122A may receive the first intermediate signal INT1 from the first XOR gate 120A and a first control signal RREN1 and provide a first row redundancy control signal (RRE1) to the memory circuitry 100 based on the signals (INT1, RREN1), and the second AND gate 122B may receive the second intermediate signal INT2 from the second XOR gate 120B and a second control signal RREN2 and provide a second row redundancy control signal (RRE2) to the memory circuitry 100 based on the signals (INT2, RREN2).

In some implementations, at least one input signal of the multiple input signals may include an address (A, Addr) that is associated with the memory circuitry 100, and as shown in FIG. 1, the comparator logic 102 may perform an address comparison that is external to the memory circuitry 100. The address (A, Addr) may refer to a faulty row address that is associated with a redundant row address. As such, in some instances, at least one bitcell array 104A, 104B of the multiple bitcell arrays 104 may include the one or more faulty rows of bitcells. The comparator logic 102 may match each of the one or more faulty rows of bitcells to a corresponding redundant row of the redundant rows of bitcells 112, 112A, 112B to disable access to each of the one or more faulty rows of bitcells and generate the row redundancy control signals (RRE1, RRE2) to enable access to the corresponding redundant row of bitcells 112, 112A, 112B.

In some implementations, as shown in FIG. 1, the multiple bitcell arrays 104, 112 may be implemented with multiple banks of bitcell arrays 104A, 104B, 112A, 112B, and the comparator logic 102 may be reused and shared across the multiple different bitcell arrays of the multiple banks of bitcell arrays 104A, 104B, 112A, 112B. I.e., the multiple bitcell arrays 104, 112 may be implemented as multiple separate memory circuits 104A, 1048, 112A, 112B, and the comparator logic 102 may be used for and shared with each of the multiple separate memory circuits 104A, 104B, 112A, 112B.

In some implementations, FIG. 1 shows a high-level block diagram of address comparison that may be achieved external to memory with an RTL wrapper. The benefit of the comparator logic being external to the memory is that the comparator logic may be shared for multiple memory instances on the SoC with higher order bits used for selecting the memory itself, when memory instances are accessed in parallel. This scheme may result in significant area leverage for SoC implementation, e.g., when using redundancy. Also, the comparator output may be fed to the memory as RRE1 and RRE2 pins, and this information may be used to enable reading out from redundant rows.

Figure 2:
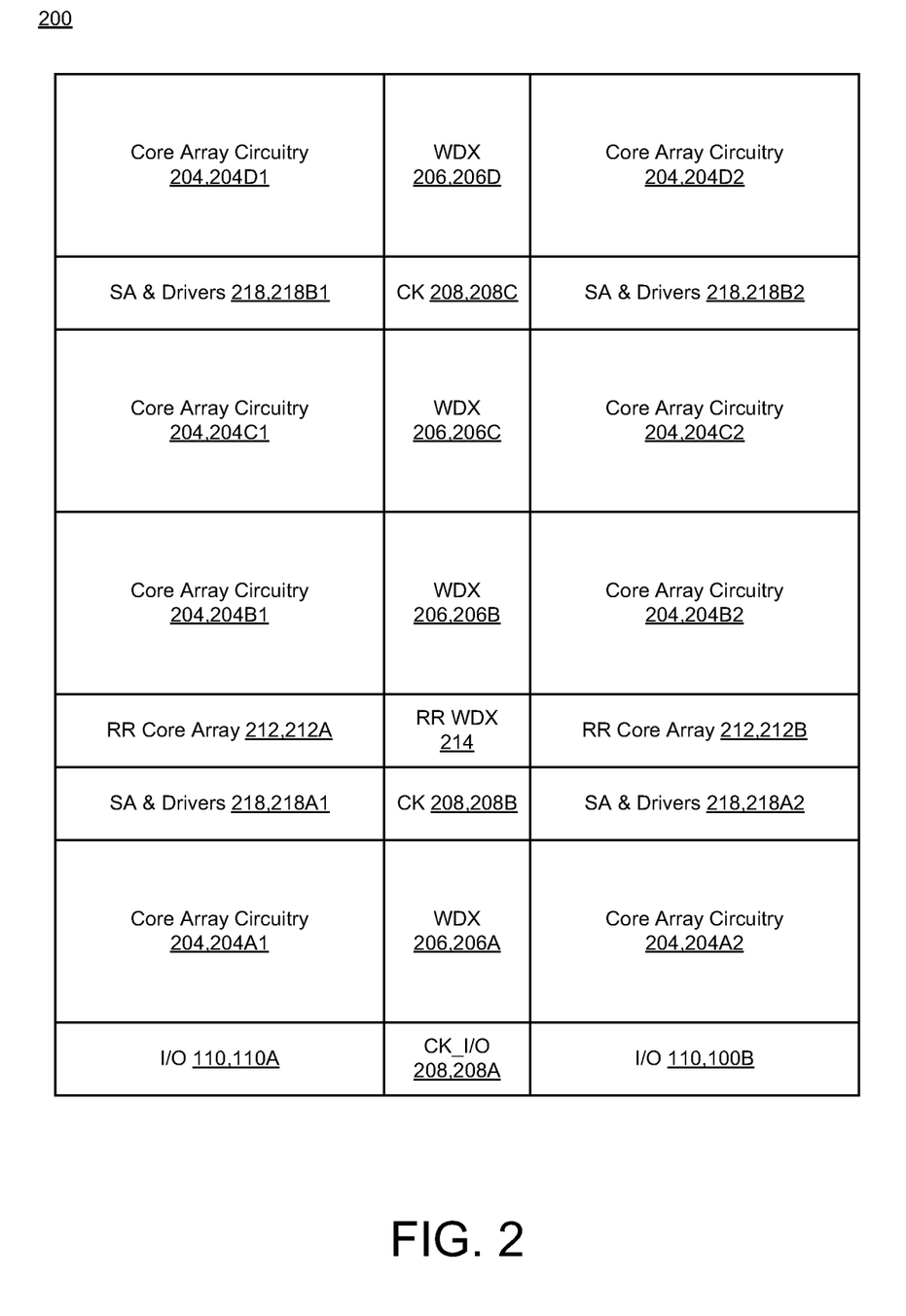
FIG. 2 illustrates a block diagram of memory circuitry having redundancy in accordance with various implementations described herein.

FIG. 2 illustrates a block diagram of memory circuitry 200 having redundancy in accordance with various implementations described herein. Various components that are described above in FIG. 2 are similar in scope, function, and operation as described in reference to the memory circuitry 100 as shown in FIG. 1.

In some implementations, the memory circuitry 200 may include multiple bitcell arrays 204 having multiple banks of bitcell arrays 204A1, 204A2, 20461, 20462, 204C1, 204C2, 204D1, 204D2. In this instance, the comparator logic 102 (of FIG. 1) may be reused and shared across multiple different bitcell arrays of the multiple banks of bitcell arrays 204A1, 204A2, 20461, 20462, 204C1, 204C2, 204D1, 204D2, as described above in reference to FIG. 1. Further, in some instances, the multiple bitcell arrays 204 may be implemented with multiple separate memory circuits 204A1, 204A2, 20461, 20462, 204C1, 204C2, 204D1, 204D2 (as multiple banks of bitcell arrays), and the comparator logic 102 (of FIG. 1) may be used for and shared with each of the multiple separate memory circuits 204A1, 204A2, 20461, 20462, 204C1, 204C2, 204D1, 204D2.

In some implementations, the memory circuitry 200 includes multiple wordline (WL) decoders 206 (WDX) and wordline (WL) redundant row (RR) decoder 214 (RR WDX) that accesses each of the corresponding banks of bitcell arrays 204 and redundant rows of bitcells 212, respectively. For instance, row decoder 206A (WDX) corresponds to bitcell arrays 204A1, 204A2, row decoder 206B (WDX) corresponds to bitcell arrays 20461, 204E32, row decoder 206C (WDX) corresponds to bitcell arrays 204C1, 204C2, and row decoder 206D (WDX) corresponds to bitcell arrays 204D1, 204D2. Further, RR row decoder 214 (RR WDX) corresponds to RR bitcell arrays 212A, 212B.

In some implementations, the memory circuitry 200 includes multiple control circuitry 208 (CK_I/O) that interfaces with corresponding input/output (I/O) circuitry 110 and sense amplifier (SA) and driver circuitry 218, respectively. For instance, control circuitry 208A (CK_I/O) interfaces with corresponding I/O circuitry 110A, 1106, control circuitry 2086 (CK) interfaces with corresponding SA and driver circuitry 218A1, 218A2, and control circuitry 208C (CK) interfaces with corresponding SA and driver circuitry 21861, 21862. Further, in some instances, the control circuitry (208, 2086, 208C) may also interface with corresponding wordline (WL) decoders 206 (WDX) and redundant row (RR) wordline (WL) decoder 214 (RR WDX).

In some implementations, FIG. 2 depicts a high-level floorplan for placing the row redundancy logic in the memory macro. This logic and redundant row may only need to appear once in the memory macro, even for a multi banked instance. Within the shared bank, the CK block may be placed at the top bank bitlines (BLs), which may be shorter when compared to the bottom bank, so that it will not negatively impact the worst case critical path from a performance standpoint.

Figure 3:
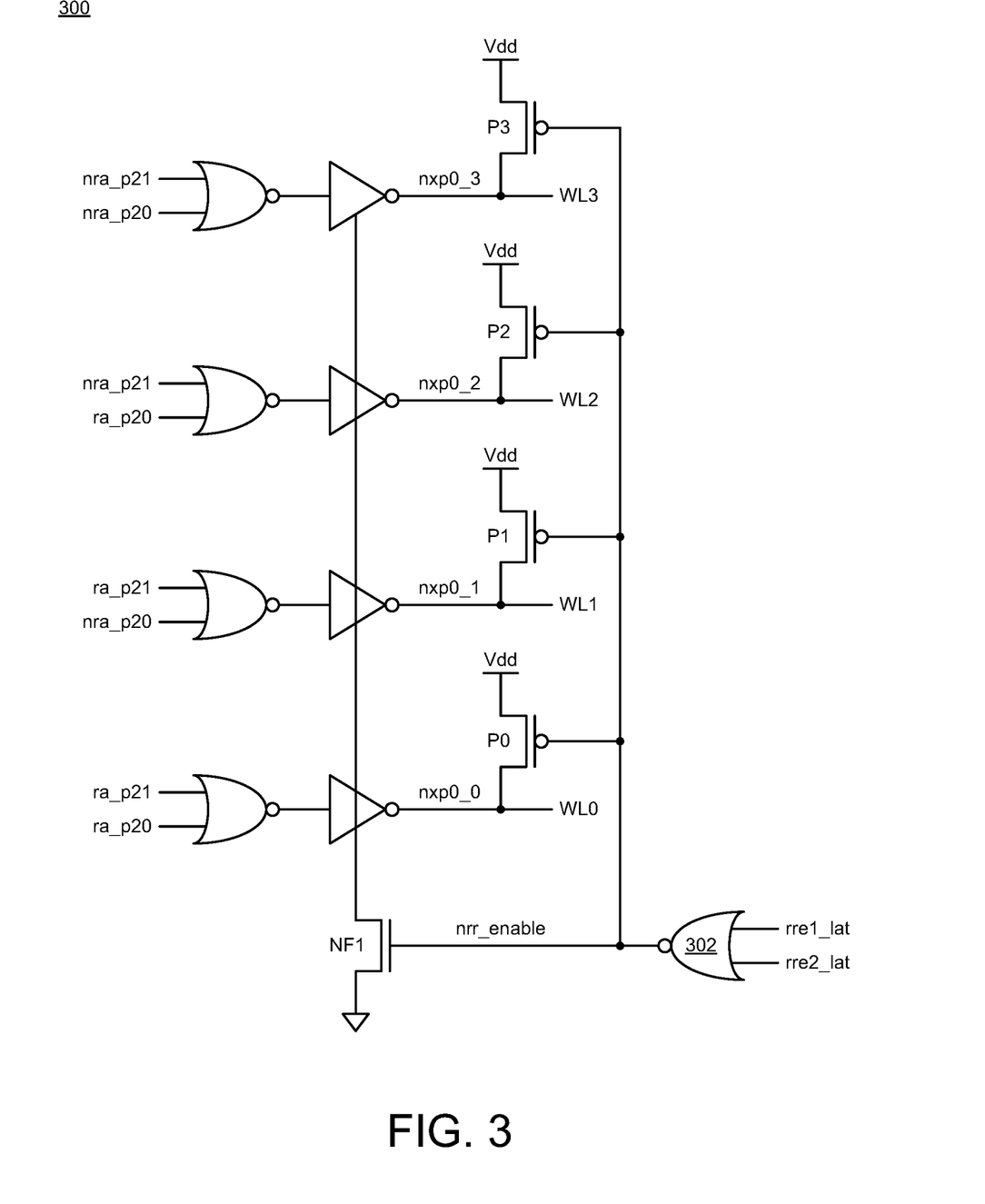
FIG. 3 illustrates a diagram of logic circuitry for de-asserting access to a faulty row of bitcells in accordance with various implementations described herein.

FIG. 3 illustrates a diagram of first logic circuitry 300 for de-asserting access to a faulty row of bitcells in accordance with implementations described herein. In some implementations, the first logic circuitry 300 may be used along with various components of the memory circuitry 200 of FIG. 2.

The first logic circuitry 300 may be used to de-assert access to the faulty row of bitcells, as described in reference to FIG. 2. The first logic circuitry 300 may include clamping devices (P0, P1, P2, P3) and a footer device (NF1) to achieve de-assertion of wordline address selection signals (nxp0_0, nxp0_1, nxp0_2, nxp0_3) to the faulty row of bitcells. As shown in FIG. 3, the clamping devices (P0, P1, P2, P3) of the first logic circuitry 300 may include clamping circuitry that is implemented with p-type metal-oxide-semiconductor (PMOS) transistors that are arranged to clamp (e.g., short the output in a high voltage state) the wordline address selection signals (nxp0_0, nxp0_1, nxp0_2, nxp0_3) (e.g., from the output of the first logic circuitry 300) based on an enable signal (nrr_enable). The clamping devices (P0, P1, P2, P3) may be coupled between a source voltage supply (Vdd) and a corresponding wordline (WL0, WL1, WL2, WL3), respectively. Further, the footer device (NF1) of the first logic circuitry 300 may be implemented with an n-type MOS (NMOS) transistor that is arranged to float a ground supply (Vss, Gnd) to the first logic circuitry 300 when (or at the same time) the wordline address selection signals (nxp0_0, nxp0_1, nxp0_2, nxp0_3) are being clamped in the high voltage state based on the enable signal (nrr_enable). In some instances, the high voltage state may be implemented with a voltage value related to a logical '1'.

The first logic circuitry 300 may include multiple wordlines (WL0, WL1, WL2, WL3) with each wordline having input logic gate circuitry that is implemented with multiple logic gates, such as, e.g., a NOR gate and a NOT gate (or inverter). As shown, each of the input logic gates receive multiple input signals and output a wordline address selection signal. For instance, the input logic gates for a first wordline WL0 receives input signals (ra_p20, ra_p21) with a NOR gate and provides the wordline address selection signal (nxp0_0) from a NOT gate, and a first clamping device (P0) is used to clamp (e.g., short the output in a high voltage state) the wordline address selection signal (nxp0_0) based on the enable signal (nrr_enable). The input logic gates for a second wordline WL1 receives input signals (nra_p20, ra_p21) with a NOR gate and provides the wordline address selection signal (nxp0_1) from a NOT gate, and a second clamping device (P1) is used to clamp the wordline address selection signal (nxp0_1) based on the enable signal (nrr_enable). The input logic gates for a third wordline WL2 receives input signals (ra_p20, nra_p21) with a NOR gate and provides the wordline address selection signal (nxp0_2) from a NOT gate, and a third clamping device (P2) is used to clamp the wordline address selection signal (nxp0_2) based on the enable signal (nrr_enable). The input logic gates for a fourth wordline WL3 receives input signals (nra_p20, nra_p21) with a NOR gate and provides the wordline address selection signal (nxp0_3) from a NOT gate, and a fourth clamping device (P3) is used to clamp the wordline address selection signal (nxp0_3) based on the enable signal (nrr_enable).

Further, as shown in FIG. 3, the first logic circuitry 300 may include another NOR gate 302 that is used to generate the enable signal (nrr_enable). For instance, the NOR gate 302 may receive multiple input signals (e.g., multiple row redundancy control signals: rre1_lat, rre2_lat) and provide the enable signal (nrr_enable) based on the input signals (e.g., multiple row redundancy control signals: rre1_lat, rre2_lat). Also, the enable signal (nrr_enable) is coupled to gates of the clamping devices (P0, P1, P2, P3) and is coupled to a gate of the footer device (NF1).

Figure 4:
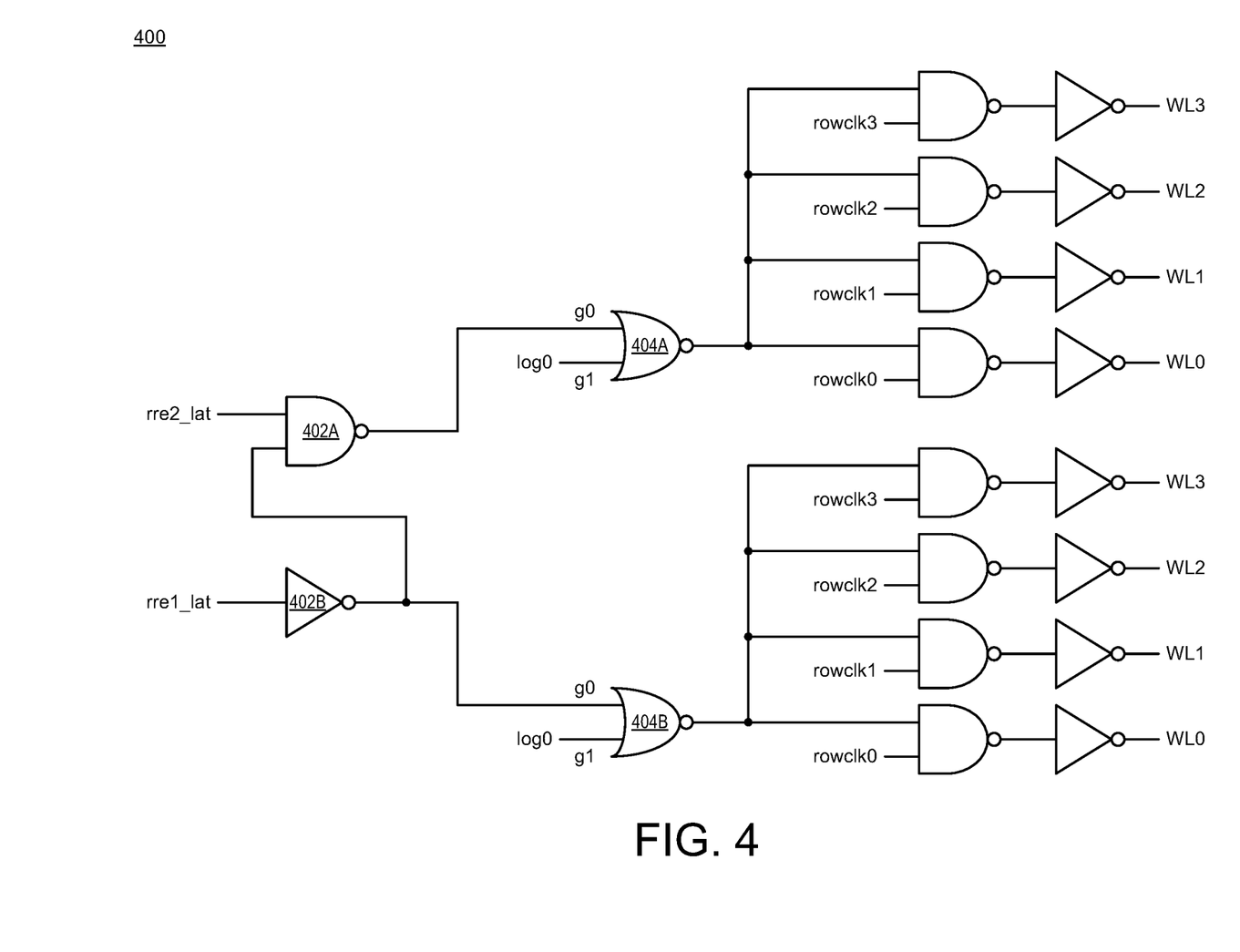
FIG. 4 illustrates a diagram of logic circuitry for asserting access to a redundant row of bitcells in accordance with various implementations described herein.

FIG. 4 illustrates a diagram of second logic circuitry 400 for asserting access to a redundant row of bitcells in accordance with implementations described herein. In some implementations, the second logic circuitry 400 may be used along with various components of the memory circuitry 200 of FIG. 2 and/or the first logic circuitry 300 of FIG. 3. Thus, the first logic circuitry 300 of FIG. 3 and the second logic circuitry 400 of FIG. 4 may be used in conjunction with the memory circuitry 200 of FIG. 2.

The second logic circuitry 400 may be used to assert access to the redundant row of bitcells, as described in reference to FIG. 2. The second logic circuitry 400 may include input logic circuitry (e.g., a NAND gate and/or a NOT gate) that receive latched comparator signals (e.g., input signals rre1_lat and rre2_lat) and provide a redundant row selection signal (g0) to access the redundant row of bitcells. For instance, as shown in FIG. 4, the input logic circuitry of the second logic circuitry 400 may be implemented with a NAND gate 402A and/or a NOT gate 402B that are arranged to receive the latched comparator signals (e.g., input signals rre1_lat and rre2_lat) and provide the redundant row selection signal (g0). Also, the second logic circuitry 400 may include wordline driver circuitry (e.g., series coupled NAND gate and NOT gate) for each wordline (WL0, WL1, WL2, WL3) that receive the redundant row selection signal and provide a wordline signal for accessing a selected row of bitcells that is associated with the faulty row of bitcells and the redundant row of bitcells.

In some implementations, the second logic circuitry 400 may use the NOT gate 402B to receive a first input signal (rre1_lat) and provide an inverted signal (g0) to a NOR gate 404B. Further, the second logic circuitry 400 may use the NAND gate 404A to receive multiple input signals including a second input signal (rre2_lat) and the inverted single (g0) from the NOT gate 402B and provide another signal (g0) to the NOR gate 404A. The NOR gate 404B receives multiple input signals including (g0, g1) and provides another signal to each of the NAND gates for each wordline (WL0, WL1, WL2, WL3). The input signal (g1) may be a ground signal (Vss, Gnd, log 0). As shown, the NAND gates for each wordline (WL0, WL1, WL2, WL3) receive multiple input signals including the output from the NOR gates 404A, 404B and a corresponding row clock signal (rowclk0, rowclk1, rowclk2, rowclk3), respectively. Also, the NAND gates for each wordline (WL0, WL1, WL2, WL3) provide an input signal for each NOT gate, and each of the NOT gates provide a corresponding wordline signal for each wordline (WL0, WL1, WL2, WL3).

In some implementations, the circuit schemes of FIGS. 3 and 4 may refer to a faulty address match (e.g., with either RRE1 or RRE2 asserted). In this instance, the NXP signals are clamped so as to shut-off the wordline (WL), as shown in FIG. 3. Also, FIG. 4 shows a circuit scheme for enabling the redundant row wordline by rowsel using g0 signal. Further, RREN1_lat may be used to select a first set of 4 redundant rows, and RREN2_lat may be used to select the second set of 4 redundant rows. In some cases, within each set of 4 redundant rows, one of the four rowclk signal may go high depending on the input address. Thus, an advantage of this scheme is that read/write timing may be the same in redundancy rows when using rowclk to go high the WL.

Figure 5:
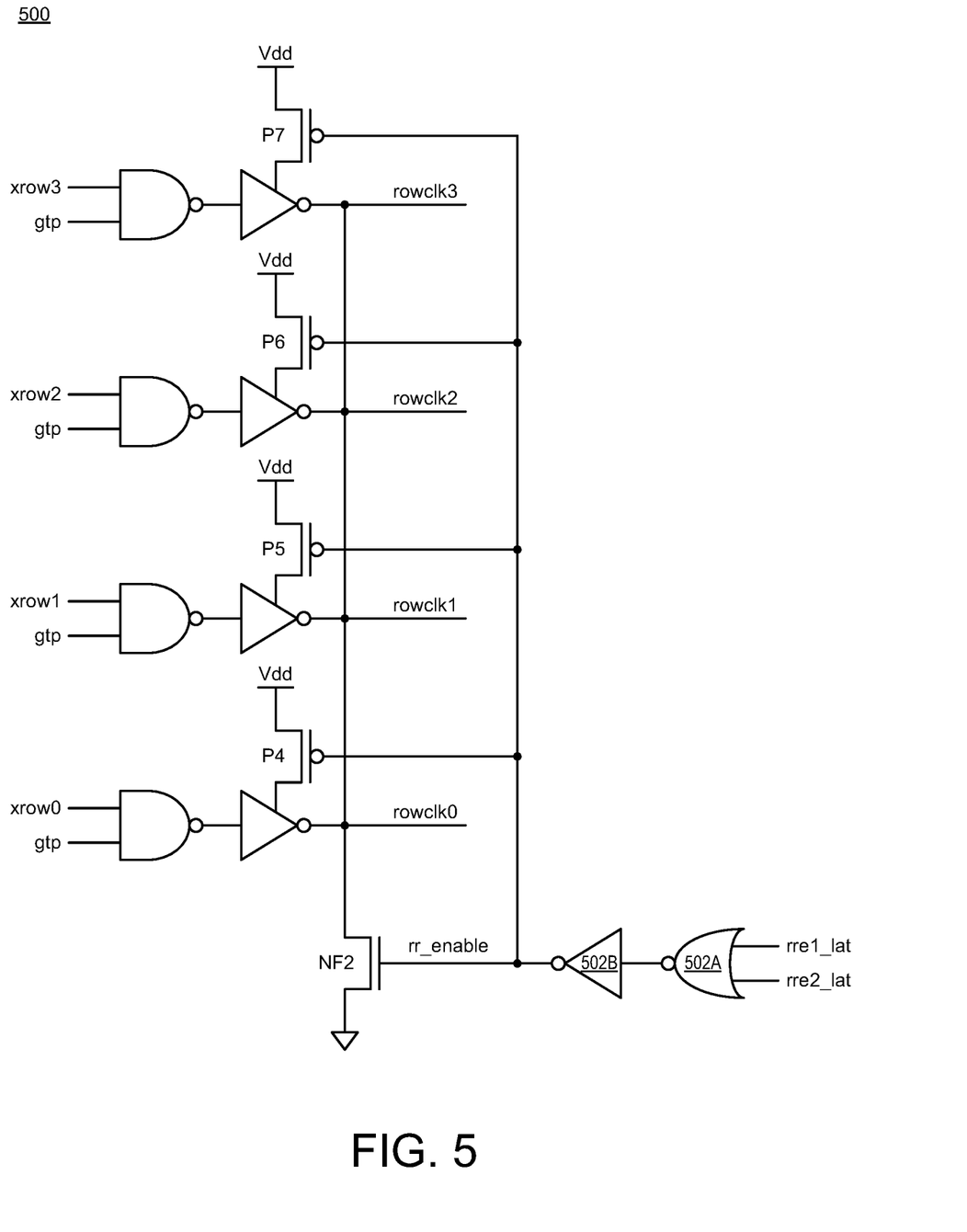
FIG. 5 illustrates another diagram of logic circuitry for de-asserting access to a faulty row of bitcells in accordance with various implementations described herein.

FIG. 5 illustrates another diagram of first logic circuitry 500 for de-asserting access to a faulty row of bitcells in accordance with implementations described herein. In some implementations, the first logic circuitry 500 may be used along with various components of the memory circuitry 200 of FIG. 2.

The first logic circuitry 500 may be used to de-assert access to the faulty row of bitcells, as described in reference to FIG. 2. The first logic circuitry 500 may include a clamping device (NF2) and header devices (P4, P5, P6, P7) to achieve de-assertion of wordline clocking signals (rowclk0, rowclk1, rowclk2, rowclk3). As shown in FIG. 5, the clamping device (NF2) of the first logic circuitry 500 may include clamping circuitry that may be implemented with an NMOS transistor that is arranged to clamp (e.g., short the output rowclk low) the wordline clocking signals (rowclk0, rowclk1, rowclk2, rowclk3) (e.g., from the output of the first logic circuitry 500) based on an enable signal (rr_enable). Also, the header devices (P4, P5, P6, P7) of the first logic circuitry 500 may include header circuitry that may be implemented with PMOS transistors that float a power or source voltage supply (Vdd) to the first logic circuitry 500 when (or at the same time) clamping the wordline clocking signals (rowclk0, rowclk1, rowclk2, rowclk3) in a low state based on the enable signal (rr_enable). In some instances, the low voltage state may be implemented with a voltage value related to a logical '0'.

The first logic circuitry 500 may include multiple clock signal (rowclk0, rowclk1, rowclk2, rowclk3) with each clock signal line having input logic gate circuitry that may be implemented with multiple logic gates, such as, e.g., a NAND gate and a NOT gate (or inverter). As shown, each of the input logic gates receives multiple input signals and output a clock signal. For instance, the input logic gates for a first clock signal line (rowclk0) may receive input signals (row selection (xrow0), global timing pulse (gtp)) with a NAND gate and provide the clock signal (rowclk0) from a NOT gate, and a first clamping device (P4) is used to clamp (e.g., short the output in a low voltage state) the clock signal (rowclk0) based on the enable signal (rr_enable). The input logic gates for a second clock signal line (rowclk1) may receive input signals (xrow1, gtp) with a NAND gate and provide the clock signal (rowclk1) from a NOT gate, and a second clamping device (P5) is used to clamp the clock signal (rowclk1) based on the enable signal (rr_enable). The input logic gates for a third clock signal line (rowclk2) may receive input signals (xrow2, gtp) with a NAND gate and provide the clock signal (rowclk2) from a NOT gate, and a third clamping device (P6) is used to clamp the clock signal (rowclk2) based on the enable signal (rr_enable). The input logic gates for a fourth clock signal line (rowclk3) may receive input signals (xrow3, gtp) with a NAND gate and provide the clock signal (rowclk3) from a NOT gate, and a fourth clamping device (P7) is used to clamp the clock signal (rowclk3) based on the enable signal (rr_enable).

Further, as shown in FIG. 5, the first logic circuitry 500 may include another NOR gate 502A and another NOT gate 502B that are used to generate the enable signal (rr_enable). For instance, the NOR gate 502A may receive multiple input signals (e.g., multiple row redundancy control signals: rre1_lat, rre2_lat) and provide an output signal to the NOT gate 502B that is inverted so as to provide the enable signal (rr_enable) based on the input signals (e.g., rre1_lat, rre2_lat). Also, the enable signal (rr_enable) is coupled to gates of the clamping devices (P4, P5, P6, P7) and is also coupled to a gate of the header device (NF2).

Figure 6:
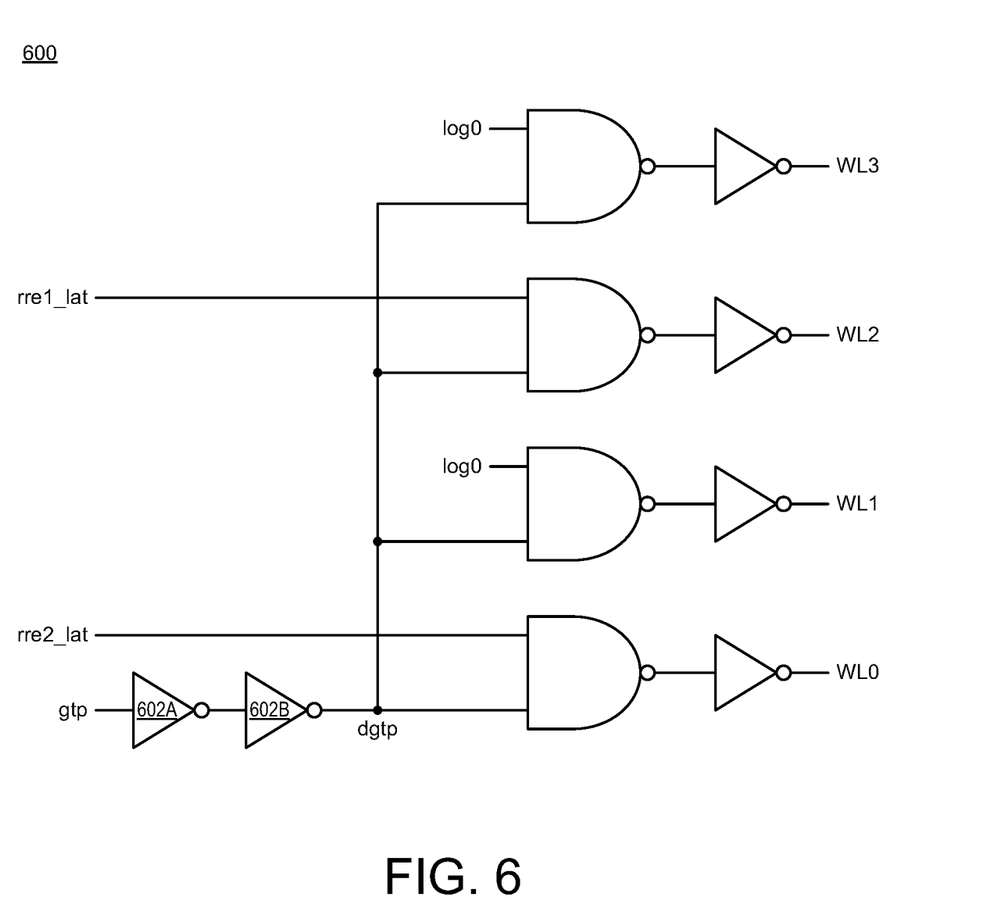
FIG. 6 illustrates another diagram of logic circuitry for asserting access to a redundant row of bitcells in accordance with various implementations described herein.

FIG. 6 illustrates another diagram of second logic circuitry 600 for asserting access to a redundant row of bitcells in accordance with implementations described herein. In some implementations, the second logic circuitry 600 may be used along with various components of the memory circuitry 200 of FIG. 2 and/or the first logic circuitry 500 of FIG. 5. Thus, the first logic circuitry 500 of FIG. 5 and the second logic circuitry 600 of FIG. 6 may be used in conjunction with the memory circuitry 200 of FIG. 2.

The second logic circuitry 600 may be used to assert access to the redundant row of bitcells, as described in reference to FIG. 2. The second logic circuitry 600 may include wordline driver circuitry (e.g., series NAND gate and NOT gate for each wordline WL0, WL1, WL2, WL3) that receives latched comparator signals (e.g., one or more of the input signals rre1_lat, rre2_lat), receives a delayed global clocking signal (e.g., dgtp), and provides wordline signals (WL0, WL1, WL2, WL3) for accessing a selected row of bitcells that is associated with the faulty row of bitcells and the redundant row of bitcells. For instance, as shown, the second logic circuitry 600 may include input logic circuitry that may be implemented with two series coupled NOT gates 602A, 602B that receives a global clocking signal (gtp) and provides the delayed global clocking signal (dgtp). Also, the wordline driver circuitry (e.g., series NAND gate and NOT gate for each wordline WL0, WL1, WL2, WL3) of the second logic circuitry 600 includes a NAND gate and a NOT gate that are arranged to receive the latched comparator signals (e.g., one or more of the input signals rre1_lat, rre2_lat), receive the delayed global clocking signal (dgtp), and provide the wordline signals (WL0, WL1, WL2, WL3) for accessing a selected row of bitcells that is associated with the faulty row of bitcells and the redundant row of bitcells.

In some implementations, the first wordline (WL0) of the second logic circuitry 600 may use a NAND gate to receive the delayed global clocking signal (dgtp) and the latched comparator signals (e.g., rre2_lat) and provide an output signal to a NOT gate for inverted output to the first wordline (WL0). The second wordline (WL1) of the second logic circuitry 600 may use a NAND gate to receive the delayed global clocking signal (dgtp) and a ground signal (Vss, Gnd, log 0) and provide an output signal to a NOT gate for inverted output to the second wordline (WL1). The third wordline (WL2) of the second logic circuitry 600 may use a NAND gate to receive the delayed global clocking signal (dgtp) and the latched comparator signals (e.g., rre1_lat) and provide an output signal to a NOT gate for inverted output to the third wordline (WL2). The fourth wordline (WL3) of the second logic circuitry 600 may use a NAND gate to receive the delayed global clocking signal (dgtp) and the ground signal (Vss, Gnd, log 0) and provide an output signal to a NOT gate for inverted output to the fourth wordline (WL3).

In some implementations, the circuit schemes of FIGS. 5 and 6 may refer to a faulty address match (e.g., with either RRE1 or RRE2 asserted), the rowclk signal may be clamped to shut-off the wordline (WL) by re-using the RET rowclk clamp/header, as shown in FIG. 5. In some cases, the rowclk clamp may need to be adequately sized to avoid a glitch on the wordline (WL). Also, the redundant row wordline may be enabled by using the rre1_lat/rre2_lat signals and combining them with the delayed gtp (i.e., dgtp) for causing redundant rows to go high, as shown in FIG. 6. A benefit of this circuit scheme is that it may only need as many redundant rows as a number of faulty rows, thus making this circuit scheme area efficient.

Figure 7:
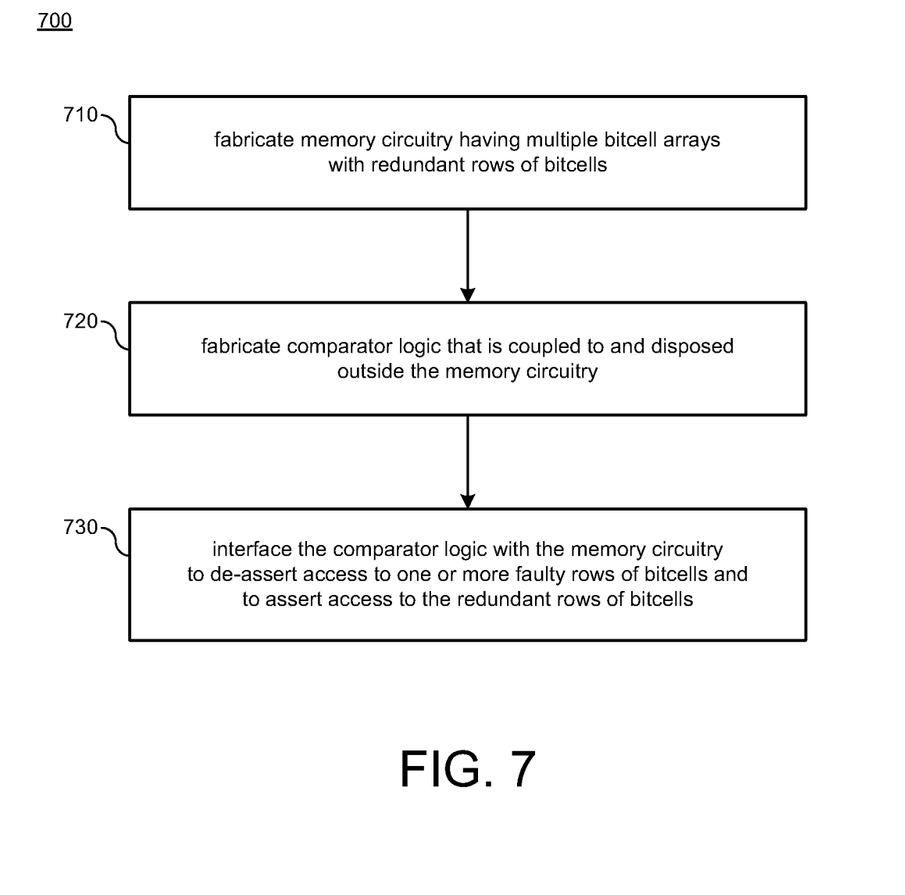
FIG. 7 illustrates a process flow diagram of a method for manufacturing an integrated circuit in accordance with various implementations described herein.

FIG. 7 illustrates a process flow diagram of a method 700 for manufacturing an integrated circuit in accordance with various implementations described herein.

It should be understood that even though method 700 may indicate a particular order of operation execution, in some cases, various certain portions of the operations may be executed in a different order, and on different systems. In other cases, additional operations and/or steps may be added to and/or omitted from method 700. Method 700 may be implemented in hardware and/or software. If implemented in hardware, the method 700 may be implemented with various circuit components, such as described herein above in reference to FIGS. 1-6. If implemented in software, method 700 may be implemented as a program or software instruction process that may be configured for implementing redundancy circuitry as described herein. Also, if implemented in software, instructions related to implementing the method 700 may be stored in memory and/or a database. For instance, a computer or various other types of computing devices having a processor and memory may be configured to perform method 700.

As described and shown in reference to FIG. 7, method 700 may be used for manufacturing an integrated circuit (IC) that implements redundancy circuitry in various types of memory applications. The integrated circuit (IC) may refer to a register transfer logic (RTL) wrapper that includes memory circuitry and comparator logic that is disposed separately from the memory circuitry within the RTL wrapper.

At block 710, method 700 may fabricate memory circuitry having multiple bitcell arrays with redundant rows of bitcells. In some instances, at least one bitcell array of the multiple bitcell arrays may refer to one or more faulty rows of bitcells.

At block 720, method 700 may fabricate comparator logic that is coupled to and disposed outside the memory circuitry. The comparator logic may include one or more control logic gates that are arranged to receive multiple input signals and provide row redundancy control signals to the memory circuitry. The one or more control logic gates of the comparator logic may be implemented with one or more XOR gates and one or more AND gates. In other instances, various other logic gates may be used. At least one input signal of the multiple input signals may include an address that is associated with the memory circuitry, and the comparator logic may perform an address comparison external to the memory circuitry. The address may refer to a faulty row address that is associated with a redundant row address.

At block 730, method 700 may interface the comparator logic with the memory circuitry to de-assert access to one or more faulty rows of bitcells and to assert access to the redundant rows of bitcells. The comparator logic may match each of the one or more faulty rows of bitcells to a corresponding redundant row of the redundant rows of bitcells to disable access to each of the one or more faulty rows of bitcells and generate row redundancy control signals to enable access to the corresponding redundant row.

In some implementations, the multiple bitcell arrays may include multiple banks of bitcell arrays, and the comparator logic may be reused and shared across multiple different bitcell arrays of the multiple banks of bitcell arrays. Further, the multiple bitcell arrays may include multiple separate memory circuits, and the comparator logic may be used for and shared with each of the multiple separate memory circuits.

Described herein are various implementations of an integrated circuit. The integrated circuit may include memory circuitry having multiple bitcell arrays with redundant rows of bitcells. The integrated circuit may include comparator logic disposed outside the memory circuitry to de-assert access to one or more faulty rows of bitcells and to assert access to the redundant rows of bitcells.

Described herein are various implementations of an integrated circuit. The integrated circuit may include memory circuitry having multiple bitcell arrays with a faulty row of bitcells and a redundant row of bitcells. The integrated circuit may include first logic circuitry that de-asserts access to the faulty row of bitcells. The first logic circuitry may include a clamp and a footer to achieve de-assertion of wordline address selection signals to the faulty row of bitcells. The integrated circuit may include second logic circuitry that asserts access to the redundant row of bitcells. The second logic circuitry may include input logic circuitry that receives latched comparator signals and provides a redundant row selection signal to access the redundant row of bitcells.

Described herein are various implementations of an integrated circuit. The integrated circuit may include memory circuitry having multiple bitcell arrays with a faulty row of bitcells and a redundant row of bitcells. The integrated circuit may include first logic circuitry that de-asserts access to the faulty row of bitcells. The first logic circuitry may include a clamp and a header to achieve de-assertion of a wordline clocking signal. The integrated circuit may include second logic circuitry that asserts access to the redundant row of bitcells. The second logic circuitry may include wordline driver circuitry that receives latched comparator signals, receives a delayed global clocking signal, and provides a wordline signal for accessing a selected row of bitcells that is associated with the faulty row of bitcells and the redundant row of bitcells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   memory circuitry having multiple bitcell arrays with redundant rows of bitcells; and
   comparator logic disposed outside the memory circuitry to de-assert access to one or more faulty rows of bitcells and to assert access to the redundant rows of bitcells, wherein the comparator logic comprises either a first clamp and a footer or a second clamp and a header to achieve the access de-assertion to the one or more faulty rows of bitcells, wherein the first clamp and the footer are configured to achieve de-assertion of wordline address selection signals to the faulty row of bitcells, and wherein the second clamp and the header are configured to achieve de-assertion of a wordline clocking signal.

2. The integrated circuit of claim 1, wherein the comparator logic comprises one or more control logic gates that are arranged to receive multiple input signals and provide row redundancy control signals to the memory circuitry.

3. The integrated circuit of claim 2, wherein the one or more control logic gates of the comparator logic comprises one or more XOR gates and one or more AND gates.

4. The integrated circuit of claim 2, wherein at least one input signal of the multiple input signals include an address that is associated with the memory circuitry, and wherein the comparator logic performs an address comparison external to the memory circuitry.

5. The integrated circuit of claim 4, wherein the address comprises a faulty row address that is associated with a redundant row address.

6. The integrated circuit of claim 1, wherein at least one bitcell array of the multiple bitcell arrays comprise the one or more faulty rows of bitcells.

7. The integrated circuit of claim 1, wherein the comparator logic matches each of the one or more faulty rows of bitcells to a corresponding redundant row of the redundant rows of bitcells to disable access to each of the one or more faulty rows of bitcells and generate row redundancy control signals to enable access to the corresponding redundant row.

8. The integrated circuit of claim 1, wherein the multiple bitcell arrays comprise multiple banks of bitcell arrays, and wherein the comparator logic is reused and shared across multiple different bitcell arrays of the multiple banks of bitcell arrays.

9. The integrated circuit of claim 1, wherein the multiple bitcell arrays comprise multiple separate memory circuits, and wherein the comparator logic is used for and shared with each of the multiple separate memory circuits.

10. The integrated circuit of claim 1, wherein the integrated circuit comprises a register transfer logic (RTL) wrapper that includes the memory circuitry and the comparator logic that is disposed separately from the memory circuitry within the RTL wrapper.

11. The integrated circuit of claim 1, wherein one of second logic circuitry or third logic circuitry is configured to assert access to the redundant row of bitcells,
wherein the second logic circuitry comprises input logic circuitry that receives latched comparator signals and provides a redundant row selection signal to access the redundant row of bitcells, and
wherein the third logic circuitry comprises wordline driver circuitry that receives latched comparator signals, receives a delayed global clocking signal, and provides a wordline signal for accessing a selected row of bitcells that is associated with the faulty row of bitcells and the redundant row of bitcells.

12. An integrated circuit, comprising:
memory circuitry having multiple bitcell arrays with a faulty row of bitcells and a redundant row of bitcells;
first logic circuitry that de-asserts access to the faulty row of bitcells, wherein the first logic circuitry includes a clamp and a footer to achieve de-assertion of wordline address selection signals to the faulty row of bitcells; and
second logic circuitry that asserts access to the redundant row of bitcells, wherein the second logic circuitry includes input logic circuitry that receives latched comparator signals and provides a redundant row selection signal to access the redundant row of bitcells.

13. The integrated circuit of claim 12, wherein the clamp of the first logic circuitry comprises clamping circuitry that clamps the wordline address selection signal based on an enable signal.

14. The integrated circuit of claim 13, wherein the footer of the first logic circuitry comprises a footer device that floats a ground supply to the first logic circuitry when clamping the wordline address selection signal in a high state based on the enable signal.

15. The integrated circuit of claim 12, wherein the input logic circuitry of the second logic circuitry comprises a NAND gate and a NOT gate that are arranged to receive the latched comparator signals and provide the redundant row selection signal.

16. The integrated circuit of claim 12, wherein the second logic circuitry comprises wordline driver circuitry that receives the redundant row selection signal and provides a wordline signal for accessing a selected row of bitcells that is associated with the faulty row of bitcells and the redundant row of bitcells.

17. An integrated circuit, comprising:
memory circuitry having multiple bitcell arrays with a faulty row of bitcells and a redundant row of bitcells;
first logic circuitry that de-asserts access to the faulty row of bitcells, wherein the first logic circuitry includes a clamp and a header to achieve de-assertion of a wordline clocking signal; and
second logic circuitry that asserts access to the redundant row of bitcells, wherein the second logic circuitry includes wordline driver circuitry that receives latched comparator signals, receives a delayed global clocking signal, and provides a wordline signal for accessing a selected row of bitcells that is associated with the faulty row of bitcells and the redundant row of bitcells.

18. The integrated circuit of claim 17, wherein the clamp of the first logic circuitry comprises a clamping device that clamps the wordline clocking signals based on an enable signal.

19. The integrated circuit of claim 18, wherein the header of the first logic circuitry comprises header circuitry that floats a power supply to the first logic circuitry when clamping the wordline clocking signals in a low state based on the enable signal.

20. The integrated circuit of claim 17, wherein the second logic circuitry comprises input logic circuitry that receives a global clocking signal and provides the delayed global clocking signal.

21. The integrated circuit of claim 17, wherein the wordline driver circuitry of the second logic circuitry comprises a NAND gate and a NOT gate that are arranged to receive the latched comparator signals, receive the delayed global clocking signal, and provide the wordline signal for accessing a selected row of bitcells that is associated with the faulty row of bitcells and the redundant row of bitcells.

* * * * *